United States Patent [19]
Fazan et al.

[11] Patent Number: 5,940,676
[45] Date of Patent: Aug. 17, 1999

[54] SCALABLE HIGH DIELECTRIC CONSTANT CAPACITOR

[75] Inventors: Pierre C. Fazan; Paul Schuele, both of Boise, Id.

[73] Assignee: Micron Technology, Inc., Boise, Id.

[21] Appl. No.: 08/971,871

[22] Filed: Nov. 19, 1997

Related U.S. Application Data

[62] Division of application No. 08/531,522, Sep. 21, 1995, Pat. No. 5,793,076.

[51] Int. Cl.$^6$ .................................................. H01L 21/00
[52] U.S. Cl. ................................ 438/3; 438/393; 438/396
[58] Field of Search ..................................... 438/238, 239, 438/240, 243, 244, 245, 248, 309, 386, 388, 210, 213, 314, 324, 326, 329, 381, 387, 396, 3

[56] References Cited

U.S. PATENT DOCUMENTS

| | | |
|---|---|---|
| 4,145,803 | 3/1979 | Tasch, Jr. . |
| 4,481,283 | 11/1984 | Kerr et al. . |
| 4,890,191 | 12/1989 | Rokos . |
| 5,037,773 | 8/1991 | Lee et al. . |
| 5,053,917 | 10/1991 | Miyasaka et al. . |
| 5,099,305 | 3/1992 | Takenaka . |
| 5,138,411 | 8/1992 | Sandhu . |
| 5,182,232 | 1/1993 | Chhabra et al. . |
| 5,187,638 | 2/1993 | Sandhu et al. . |
| 5,217,914 | 6/1993 | Matsumoto et al. . |
| 5,223,448 | 6/1993 | Su . |
| 5,227,855 | 7/1993 | Momose . |
| 5,241,201 | 8/1993 | Matsuo et al. . |
| 5,278,091 | 1/1994 | Fazan et al. . |
| 5,293,510 | 3/1994 | Takenaka . |
| 5,349,494 | 9/1994 | Ando . |
| 5,366,920 | 11/1994 | Yamamichi et al. . |
| 5,369,296 | 11/1994 | Kato . |
| 5,418,180 | 5/1995 | Brown . |
| 5,429,972 | 7/1995 | Anjum et al. . |
| 5,443,688 | 8/1995 | Toure et al. . |
| 5,444,013 | 8/1995 | Akram et al. . |
| 5,495,117 | 2/1996 | Larson . |
| 5,555,486 | 9/1996 | Kingon et al. . |
| 5,595,928 | 1/1997 | Lu et al. . |
| 5,612,082 | 3/1997 | Azuma et al. . |
| 5,696,017 | 12/1997 | Ueno . |
| 5,741,722 | 4/1998 | Lee . |

OTHER PUBLICATIONS

"Hemispherical Grained Si Formation on in–situ Phosphorous Doped Amorphous–Si Electrode for 256Mb DRAM's Capacitor", Watanabe, et al., IEEE Transactions on Electron Devices, vol. 42, No. 7, Jul. 1995, pp. 1247–1254.

"Oxide Spacers", Multilevel–Interconnect Technology for VLSI and ULSI, vol. II pp. 212–214.

Matsuo, et al., "Spread–Vertical–Capacitor Cell (SVC) for High Density dRAM's," IEEE Transactions on Electron Devices, vol. 40, No. 4, Apr., 1993, pp. 750–754.

*Primary Examiner*—John F. Niebling
*Assistant Examiner*—Jonathan Hack
*Attorney, Agent, or Firm*—Knobbe Marten Olson & Bear, LLP

[57] ABSTRACT

A capacitor for high density DRAM applications comprises a high-$\epsilon$ capacitor dielectric such as BST or PZT in an arrangement which obviates the need for barrier layers during fabrication. The fabrication process allows for electrode placement by simple sputter deposition and further provides for the possibility of capacitor spacing below that of conventional lithographic techniques.

17 Claims, 5 Drawing Sheets

SCALABLE HIGH DIELECTRIC CONSTANT CAPACITOR

This application is a divisional of U.S. patent application Ser. No. 08/531,522, filed Sep. 21, 1995 U.S. Pat. No. 5,793,076.

This invention was made with Government support under Contract No. MDA972-93-C-0033 awarded by Advanced Research Projects Agency (ARPA). The Government has certain rights in this invention.

FIELD OF THE INVENTION

The invention relates generally to integrated semiconductor memory devices. In particular, the invention pertains to design and fabrication of cell capacitors having high dielectric constant useful in high-density Dynamic Random Access Memory arrays.

BACKGROUND OF THE INVENTION

A dynamic random access memory (DRAM) cell typically comprises a charge storage capacitor (or cell capacitor) coupled to an access device such as a Metal-Oxide-Semiconductor Field Effect Transistor (MOSFET). The MOSFET functions to apply or remove charge on the capacitor, thus affecting a logical state defined by the stored charge. The amount of charge stored on the capacitor is determined by the capacitance, $C=\epsilon\epsilon_0 A/d$, where $\epsilon$ is the dielectric constant of the capacitor dielectric, $\epsilon_0$ is the vacuum permitivity, A is the electrode (or storage node) area and d is the interelectrode spacing. The conditions of DRAM operation such as operating voltage, leakage rate and refresh rate, will in general mandate that a certain minimum charge be stored by the capacitor.

In the continuing trend to higher memory capacity, the packing density of storage cells must increase, yet each will maintain required capacitance levels. This is a crucial demand of DRAM fabrication technologies if future generations of expanded memory array devices are to be successfully manufactured. Nevertheless, in the trend to higher memory capacity, the packing density of cell capacitors has increased at the expense of available cell area. For example, the area allowed for a single cell in a 64-Mbit DRAM is only about 1.4 $\mu m^2$. In such limited areas, it is difficult to provide sufficient capacitance using conventional stacked capacitor structures. Yet, design and operational parameters determine the minimum charge required for reliable operation of the memory cell despite decreasing cell area. Several techniques have been developed to increase the total charge capacity of the cell capacitor without significantly affecting the cell area. These include new structures utilizing trench and stacked capacitors, electrodes having textured surface morphology and new capacitor dielectric materials having higher dielectric constants.

As DRAM density has increased (1 MEG and beyond) thin film capacitors, such as stacked capacitors, trenched capacitors, or combinations thereof, have evolved in attempts to meet minimum space requirements. Many of these designs have become elaborate and difficult to fabricate consistently as well as efficiently. Furthermore, the recent generations of DRAMs (4 MEG, 16 MEG for example) have pushed thin film capacitors technology to the limit of processing capability. Thus, greater attention has been given to the development of thin film dielectric materials that possess a dielectric constant significantly greater (>10x) than the conventional dielectrics used today, such as silicon oxides or nitrides.

Recently, a lot of attention has been paid to Barium Strontium Titanate (BST), Barium Titanate (BT), Strontium Titanate (ST), Lead Zirconate Titanate (PZT) and other high dielectric constant materials as a cell dielectric material of choice for DRAMs. These materials, in particular BST, have a high dielectric constant (>300) and low leakage currents which makes them very attractive for high density memory devices. However, there are some technical difficulties associated with these materials. One problem with incorporating these materials into present day DRAM cell designs is their chemical reactivity with the polycrystalline silicon (polysilicon or "poly") that conventionally forms the capacitor electrode or a buried electrode contact. Capacitors made by polysilicon-PZT/BST sandwiches undergo chemical and physical degradation with thermal processing. During chemical vapor deposition (CVD) of PZT/BST, oxygen in the ambient tends to oxidize the electrode material. The oxide is undesirable since it has a much lower dielectric constant compared to PZT/BST and adds in series to the capacitance of the PZT/BST, thus drastically lowering the total capacitance of the capacitor. Therefore, even a thin native oxide layer present on the electrode results in a large degradation in capacitance. Furthermore, even when the electrode proper is made of a noble metal, such as Pt, oxygen will still tend to diffuse through it, contaminating the underlying polycrystalline silicon plug.

An approach to the problem is disclosed in U.S. Pat. No. 5,187,638 by G. Sandhu and P. Fazan, herein incorporated by reference, wherein a transition metal, such as Molybdenum, is used as a capacitor plate. A conducting transition metal oxide forms at the interface between the transition metal and the PZT/BST material, thereby forming a barrier layer between the PZT/BST material and Mo electrode.

Another solution to the problem is to introduce a diffusion barrier or barrier layer between the polysilicon plug and an upper portion of the capacitor plate. For example, a triple layer cell plate consisting of poly-Si/Ta/Pt is disclosed in "A STACKED CAPACITOR WITH (BaxSr1-x) TiO3 for 256M DRAM", K. Koyama et al., IEDM 91, pp 823–826, and U.S. Pat. No. 5,053,917, Miyasaka et al. In these references Tantalum, overlaying the silicon, functions as a diffusion barrier, preventing oxygen from migrating into the polysilicon region. In other designs TiN is used as the barrier layer, which unfortunately also tends to oxidize upon further processing. In general, a common problem associated with barrier layers is that they tend to break down during subsequent processing, eventually allowing cross diffusion between the high-$\epsilon$ material and the underlying electrode or polycrystalline silicon plug. Furthermore, such structures are complex and cumbersome to integrate into a manufacturing process flow.

FIG. 1 schematically illustrates a prior art DRAM having a high-$\epsilon$ capacitor with a barrier layer susceptible to breakdown. The capacitor structures 18 are generally fabricated in a stacked arrangement disposed over integrated access devices such as MOSFETS and the like. The wafer 20 may for example include field isolation regions 22, active areas 24, word lines 26 and bit lines 28. The capacitor structure is disposed over a buried contact usually comprised of a polysilicon plug 30 making electrical contact between the silicon substrate 20 and capacitor structure 18. The capacitor 18 may comprise an inner electrode 14 such as platinum, deposited over a conductive barrier layer 17 such as tantalum or TiN. A high-$\epsilon$ dielectric layer 15 is deposited over the inner electrode 14. High-$\epsilon$ materials proposed for such capacitor structures include BT, ST, BST and PZT. An outer electrode layer 16 is deposited over substantially the entire structure to serve as a common reference electrode. As mentioned earlier, the barrier layer 17 functions as a diffusion barrier for chemical species during processing of the dielectric layer 15 so that the underlying polysilicon plug 30 does not become contaminated or oxidized. For example, silicon atoms from the polysilicon plug may diffuse and oxidize near the electrode surface, where they would create a $SiO_2$ film having relatively low dielectric constant. However, a common problem in the design and fabrication of such capacitors is the oxidation and partial breakdown of the barrier layer 17 during deposition of dielectric layer 15 or during subsequent thermal processing. Thus, materials and processes must be developed in order to provide simple, cost effective integration of high-$\epsilon$ materials into high-density DRAM capacitors.

SUMMARY OF THE INVENTION

It is an object of the present invention to provide a thin film capacitor array having an enhanced capacitance useful for high-density DRAM applications. The high capacitance is achieved through use of materials having high dielectric constant for the capacitor dielectric. A second object of the present invention is to provide a more reliable and economic process by which to fabricate DRAM capacitors using high-$\epsilon$ materials as the capacitor dielectric. A third object of the present invention is to provide a DRAM fabrication process which allows storage capacitor formation at densities greater than that achievable by conventional photolithographic means.

In accordance one aspect of the present invention, a process for fabricating a capacitor in a semiconductor integrated circuit comprises forming an outer conductive layer by first depositing a lower insulative layer over a portion of the integrated circuit having a buried contact, then depositing a conductive layer, such as Pt, over the lower insulative layer. The outer conductive layer is covered by depositing an upper insulative layer. The capacitor region is formed by removing a portion of the upper insulative layer and the outer conductive layer to define a hollow region having an outer capacitor electrode comprising the remaining portion of the outer conductive layer bounding the capacitor region. Then, a dielectric layer is deposited superjacent to the capacitor region, wherein the dielectric layer comprises a material having a high dielectric constant such as barium titanate, strontium titanate, barium strontium titanate or lead zirconate titanate. The inner electrode is formed by first depositing an inner conductive layer superjacent to the dielectric layer, and then removing a portion of the inner conductive layer to form a storage node electrode within the capacitor region. The storage node electrodes are preferably comprised of a transition metal complex such as TiN. The capacitor structure is then formed by removing portions of the dielectric layer to form a capacitor dielectric interposed between the storage node electrode and the common capacitor electrode. A buried contact in the integrated circuit is exposed to the capacitor region by removing a portion of the lower insulative layer. The basic capacitor structure is completed by depositing an inner conductive layer, such as TiN, over the capacitor region thereby electrically connecting the buried contact to the storage node electrode. The DRAM capacitor is preferably further processed by depositing a another conductive material such as CVD-tungsten over the inner conductive layer to substantially completely cover the capacitor region and then planarizing the capacitor region to form an inner capacitor electrode insulated from the common electrode by the capacitor dielectric.

In accordance with another aspect of the present invention a thin film capacitor in an integrated circuit comprises an inner electrode made from a transition metal complex such as TiN. The inner electrode is further electrically connected to a silicon substrate. A dielectric layer having a high dielectric constant is disposed on a portion of the inner electrode. A preferred material for the dielectric layer may comprise Barium Titanate, Strontium Titanate, Barium Strontium Titanate or Lead Zirconate Titanate. An outer electrode is disposed adjacent to the dielectric layer and preferably comprises a metal such as Pt.

In accordance with another aspect of the present invention, a method for fabricating an array of DRAM storage capacitors first comprises the step of forming an outer conductive layer over a portion of an integrated circuit having a plurality of DRAM access devices and a plurality of buried contacts thereto; then removing portions of the outer conductive layer to define capacitor regions disposed over the buried contacts, wherein capacitor regions have a common outer electrode comprising the outer conductive layer bounding the capacitor regions. Subsequently a dielectric layer is deposited superjacent to the capacitor regions, wherein the dielectric layer comprises a material having a high dielectric constant. Then, an inner conductive layer is deposited superjacent to the dielectric layer. Portions of the inner conductive layer and dielectric layer within the capacitor regions are removed to expose the buried contacts. An electrical connection between the inner conductive layer and the buried contacts is formed by depositing another conductive layer over the capacitor regions, thus completing a basic embodiment of the capacitor.

In accordance with yet another aspect of the present invention, a method of fabricating an array of thin film capacitors in an integrated circuit comprises first the step of forming a common electrode layer over the integrated circuit, wherein the common electrode layer has an array of capacitor regions disposed therethrough. Then a dielectric layer is deposited superjacent to the array of capacitor regions, wherein the dielectric layer comprises a material having a high dielectric constant. Inner electrodes are then formed within the capacitor regions, adjacent to the dielectric layer, thereby forming an array of capacitors having a common outer electrode layer.

These and other objects and features of the present invention will become more fully apparent from the following description with reference to the accompanying drawings.

BRIEF DESCRIPTION OF THE DRAWINGS

FIG. 1 schematically illustrates a prior art DRAM having a high-$\epsilon$ capacitor.

FIG. 2 is a schematic section of an exemplary planarized front-end DRAM cell formation;

FIG. 3 is a schematic section illustrating deposition of a thick conducting layer;

FIG. 4 is a schematic section showing the upper insulating layer;

FIG. 5 is a schematic section showing the patterned and etched upper insulator/conductor stack;

FIG. 6 is a schematic section showing the high-$\epsilon$ capacitor dielectric layer;

FIG. 7 is a schematic section illustrating the storage node electrode layer;

FIG. 8 is a schematic section showing formation of the storage node electrodes;

FIG. 9 is a schematic section showing etchback of the high-$\epsilon$ capacitor dielectric;

FIG. 10 is a schematic section showing etchback of the plug insulator;

FIG. 11 is a schematic section showing deposition of a conductive electrode liner;

FIG. 12 is a schematic section showing the conductive filler;

FIG. 13 is a schematic section showing planarization resulting in cell storage capacitors.

DETAILED DESCRIPTION OF THE INVENTION

The present invention is directed to a novel inverted stacked DRAM storage cell having a scalable high-$\epsilon$ capacitor. The inventive aspects are herein disclosed in connection with a DRAM process flow, the description of which follows from an embodiment of a DRAM process flow beginning with the storage capacitor fabrication.

Figure 1:
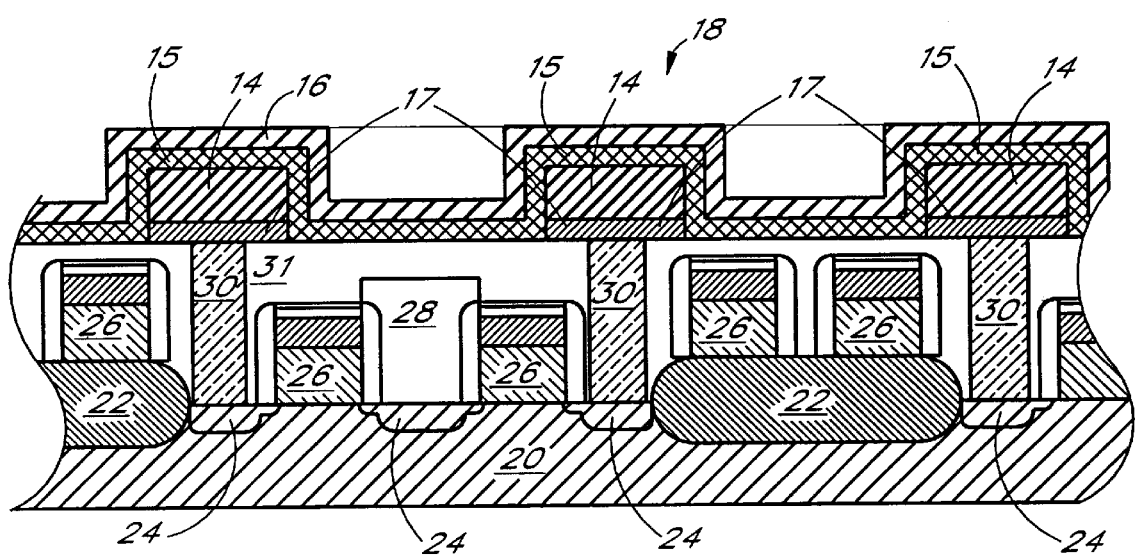
FIGS. 1–13 are schematic sections illustrating a DRAM process flow of the present invention.
Figure 2:
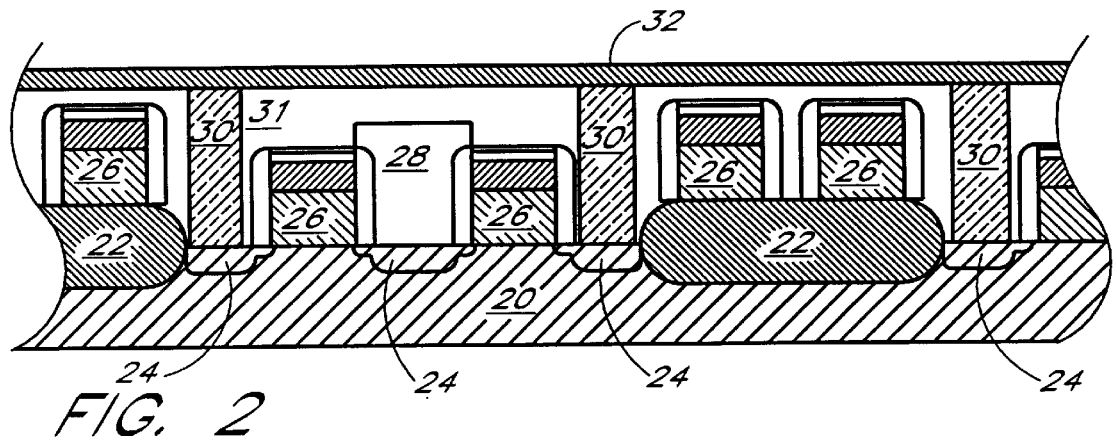

Referring to FIG. 2, a conventional front-end DRAM cell formation comprises a silicon wafer 20 processed to a point where capacitor fabrication begins. At this stage in the fabrication process, the DRAM cell may have field oxide regions 22, active regions 24, word lines 26, bit lines 28 and capacitor plugs 30. Capacitor fabrication begins with a planarized isolation layer 31 usually comprising silicon dioxide ($SiO_2$ or oxide) or silicon nitride ($Si_3N_4$ or nitride) which is deposited conformally over the entire structure as a base for capacitor formation. The storage capacitors to be described are fabricated over the polysilicon plugs 30, which form buried conductive contacts with the active regions 24. A first step in fabricating the storage capacitor is depositing a lower insulating layer 32 such as silicon dioxide or silicon nitride on the planarized top surface of the wafer formation. The oxide or nitride may be deposited by known methods such as low pressure- or plasma enhanced- chemical vapor deposition. The thickness of the first dielectric layer 32 may be about 30 nm, but is preferably not greater than about 100 nm.

Figure 3:
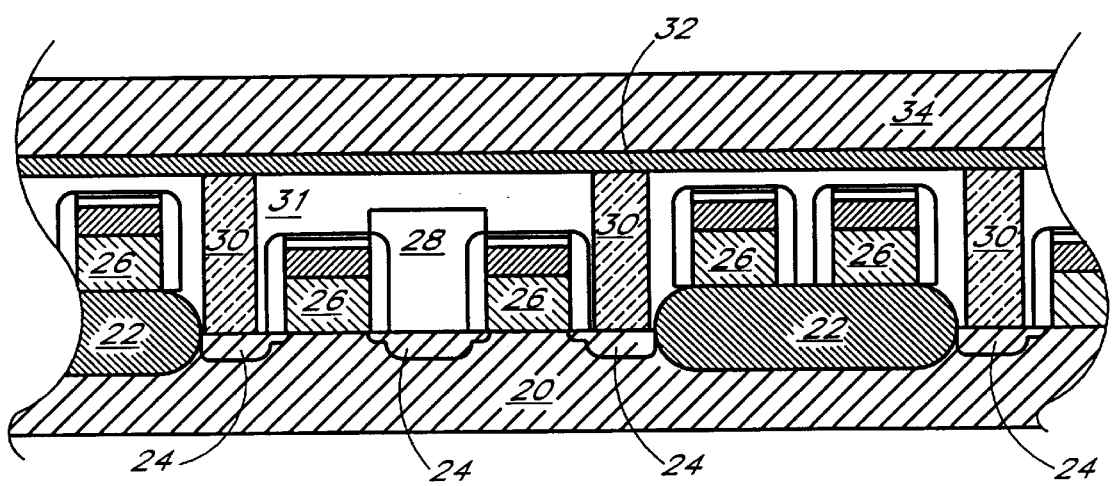

As shown in FIG. 3, a thick conductive layer 34 is deposited over the first dielectric layer 32. The conductive layer may be a noble metal such as Pt or a conducting oxide such as $RuO_2$ or nitride such as TiN. As will be seen later in the description, the thickness of the conductive layer 34 substantially determines the wall height of the completed capacitor structure. A presently preferred thickness of the conductive layer 34 may be in the range of 100 nm to 1000 nm and preferably greater than 200 nm. The conductive layer 34 will eventually be patterned and etched to form the common capacitor electrode, therefore the conductivity of the material must be high. At this point in the process flow, the wafer surface being relatively flat and passive advantageously affords the possibility of choosing a wider range of material for the conductive layer 34. Thus, easily processed materials such as noble metals or conducting oxides may be sputter deposited to form the conductive layer 34. In terms of process cost and complexity, sputter depositing a common cell electrode represents a significant advantage over other more conventional materials and processes. Furthermore, as mentioned earlier, the thickness of the layer 34 establishes the height of the capacitor, which is easily controlled by the preferred deposition process.

Figure 4:
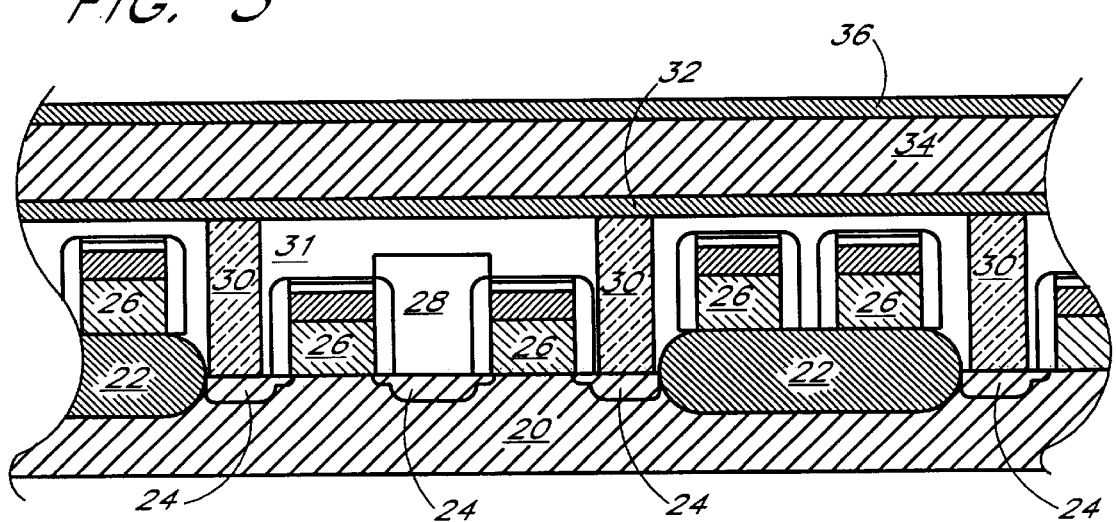

Following deposition of the conductive layer 34, an upper insulating layer 36 is deposited over the entire structure, as shown in FIG. 4. The upper insulating layer 36 may be a layer of oxide or nitride deposited as mentioned earlier. The upper layer 36 should however be thicker than the lower insulating layer 32, and may additionally serve as a hard mask for etching the conductive layer 34. While, the upper insulating layer 36 should have a thickness greater than the lower insulating layer 32, it preferably should not exceed a thickness of about 150 nm.

Figure 5:
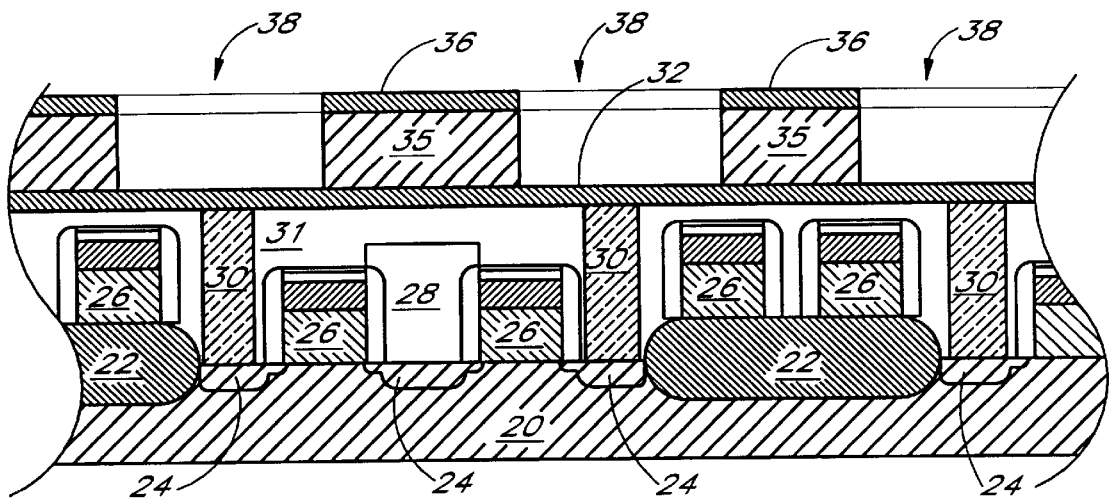

The stack comprising the upper insulating layer 36 and conducting layer 34 is then patterned by conventional photolithographic means to define regions about each polysilicon plug 30 corresponding to the location of the storage capacitors. Following the lithography step, the patterned regions are etched through to the lower insulating layer 32, to form voids within which the capacitors are formed. As shown in FIG. 5, the etched regions 38 of conductive layer 34 are located over the polysilicon plugs 30. The etched conductive layer 35 forms the common electrode for all of the cells in an array block. Using process techniques such as lithographically overexposing the etch mask or isotropically etching the conductive layer 34, the voids 38 may be enlarged to render a capacitor spacing less than that attainable by conventional lithographic means. For example, the capacitor regions therein defined by removing portions of the conductive layer 34 may be separated by remaining portions of the conductive layer 35 having dimensions less than 100 nm, which is less than that achievable through present conventional photolithographic techniques. The possibility of arranging cell capacitors at dimensional tolerances less than the lithographic limit represents a significant advantage for high-density DRAM arrays.

Figure 6:
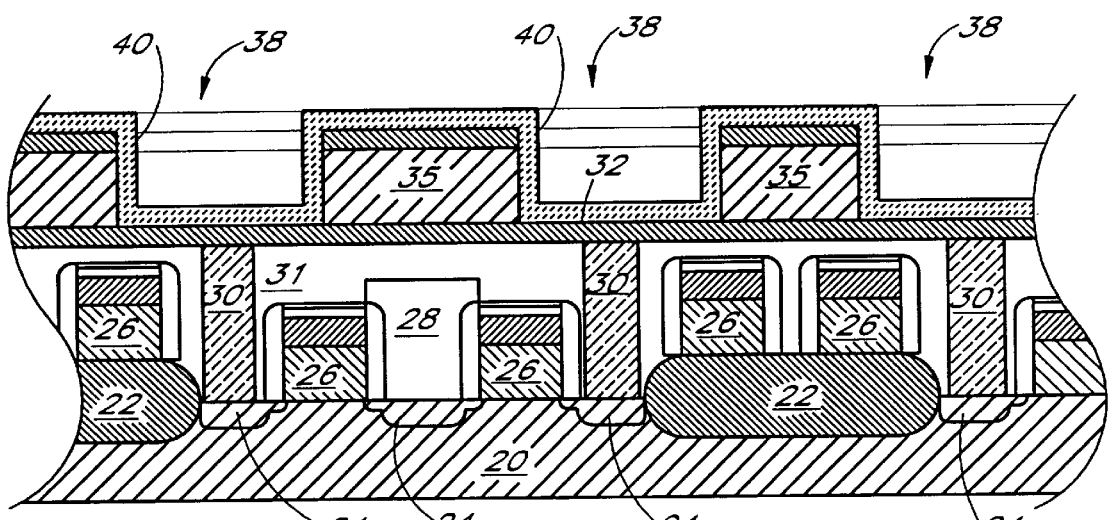

After etching to form the common electrode 35, a layer of ferroelectric or high-$\epsilon$ dielectric material 40 is deposited over the entire structure as shown in FIG. 6. The high-epsilon material serves as the capacitor dielectric in the completed structure. The capacitor area is defined by the inside surface area of the void 38 etched in the conductive layer 34 and can be easily adjusted by the sputtered thickness of the conductive layer 34. However, the capacitance of the resulting structure will depend upon the thickness of dielectric layer 40, which is preferably minimized with respect to other constraints such as electrical leakage properties. The dielectric layer 40 should have a thickness less than about 50 nm. In some embodiments of the present invention, use of high-$\epsilon$ materials for the capacitor dielectric may allow the dielectric to be thicker than prior art materials such as silicon oxides or nitrides, thereby suppressing electrical leakage while maintaining high capacitance.

A high$\epsilon$ material suitable for the present invention should have a dielectric constant $\epsilon$ greater than about 100. Possible high-$\epsilon$ materials for the capacitor dielectric include Barium Strontium Titanate ($Ba_xSr_{1-x}TiO_3$ or BST), Barium Titanate ($BaTiO_3$ or BT), Strontium Titanate ($SrTiO_3$) or Lead Zirconate Titanate ($PbZr_xT_{1-x}iO_3$ or PZT). A presently anticipated preferred material is BST which possesses a dielectric constant greater than about 300. BST is particularly promising in light of good electrical leakage characteristics displayed in experimental device structures. A BST layer 40 is preferably deposited by chemical vapor deposition techniques comprising reacting volatile complexes containing Ba, Sr and Ti in an oxygen ambient. Such deposition techniques are well-known to those skilled in the art of thin film deposition. As the polysilicon plug 30 is still isolated from the dielectric film 40 by the lower insulating layer 32, no barriers layers are needed as in prior art process integration. Considering that the barrier weaknesses and failure during BST or other high-$\epsilon$ film deposition is a major obstacle to the integration of BST or high-ε capacitors this aspect of the present invention is particularly advantageous for high-ε capacitor device integration.

Figure 7:
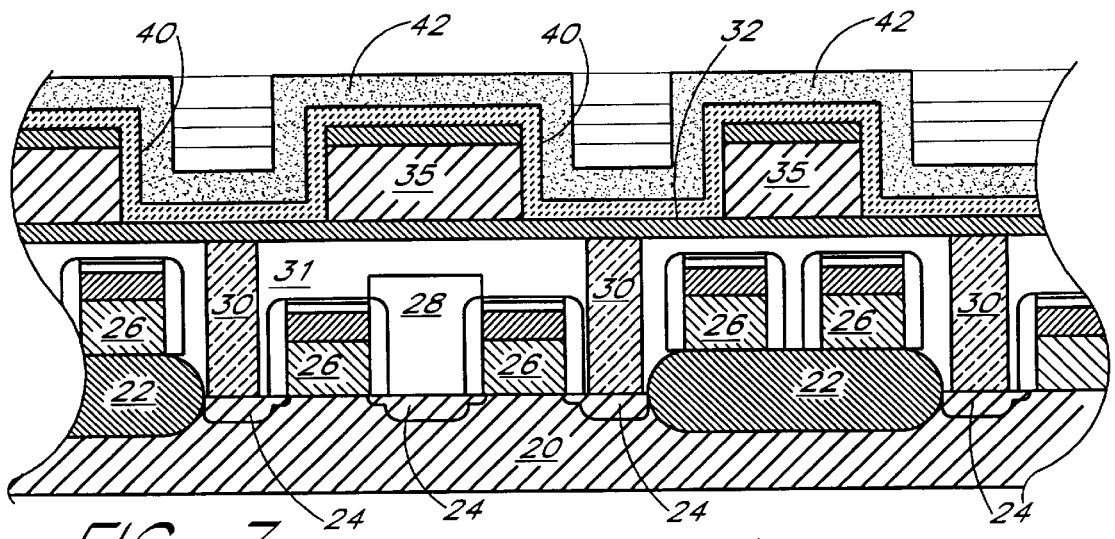

After depositing the capacitor dielectric 40, a top electrode layer 42 is deposited over the dielectric layer 40, as shown in FIG. 7. The top electrode layer 42 may comprise a film of a stable, highly conductive material which is conformally deposited over the dielectric layer 40 and does not react with it. Candidates include CVD-deposited transition metal oxides or nitrides. Titanium nitride is preferable because of its high conductivity, good temperature stability, and ease of deposition by CVD. The top electrode layer 42 is preferably deposited to a thickness range of approximately 10 nm to 100 nm.

Figure 8:
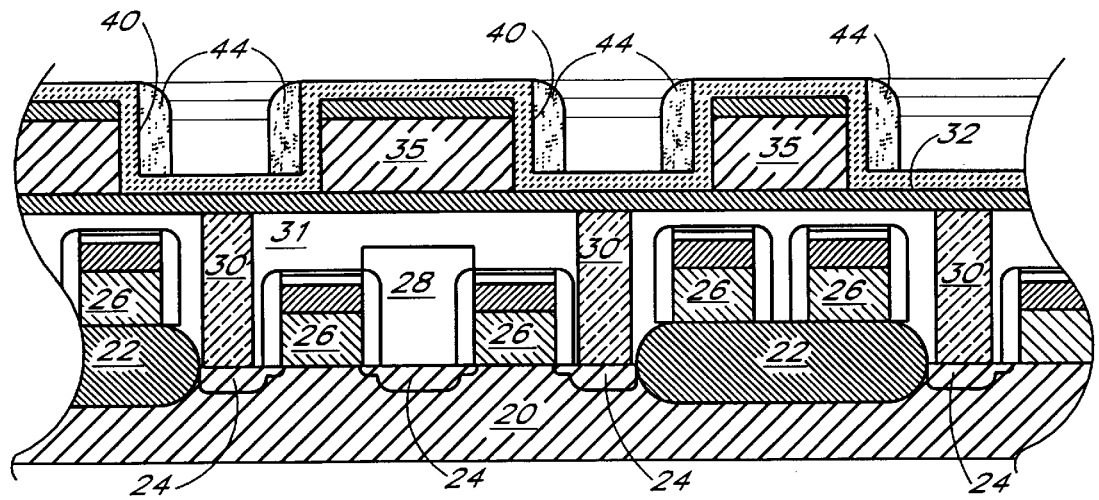

As shown in FIG. 8, the next process step comprises forming the storage nodes 44 from the electrode layer 42 deposited in the previous process step. To accomplish this, an anisotropic etch is performed on the top electrode material 42 to form top electrode spacers 44 that will act as storage node electrodes. A typical anisotropic etch may comprise ion bombardment of the surface with energetic reactive ions, such as those of halogen complexes. Even though the anisotropic etch may damage the dielectric material 40 in regions between capacitor structures, this portion of the layer 40 does not form part of the completed capacitor and therefore such damage will not pose a problem.

Figure 9:
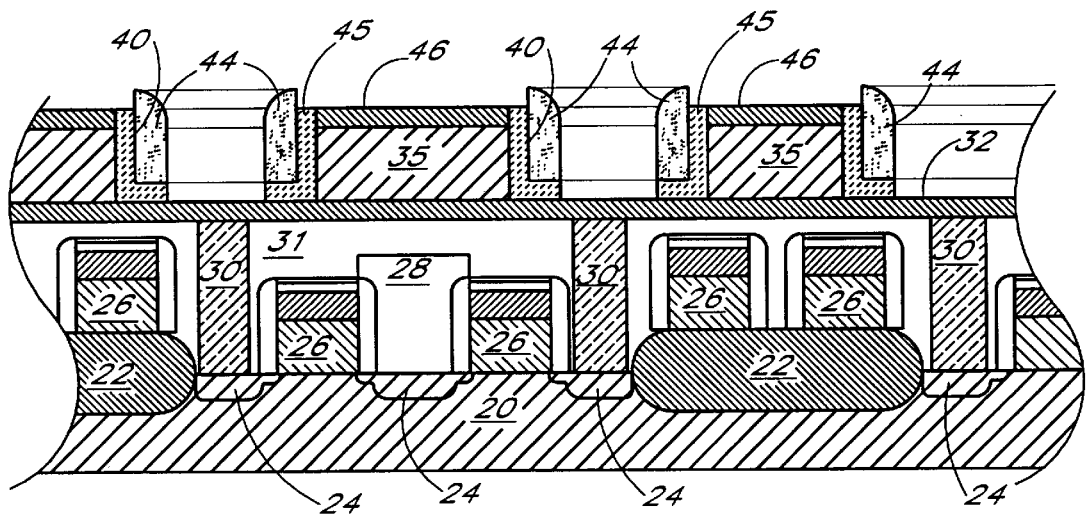

As shown in FIG. 9, exposed portions of the capacitor dielectric layer 40 are removed. The exposed portion of the dielectric layer 40 is removed by dry reactive ion etching, preferably using a complex displaying selectivity for the dielectric material. Dielectric regions 45 sandwiched between the storage nodes 44 and common electrode 35 will remain intact.

Figure 10:
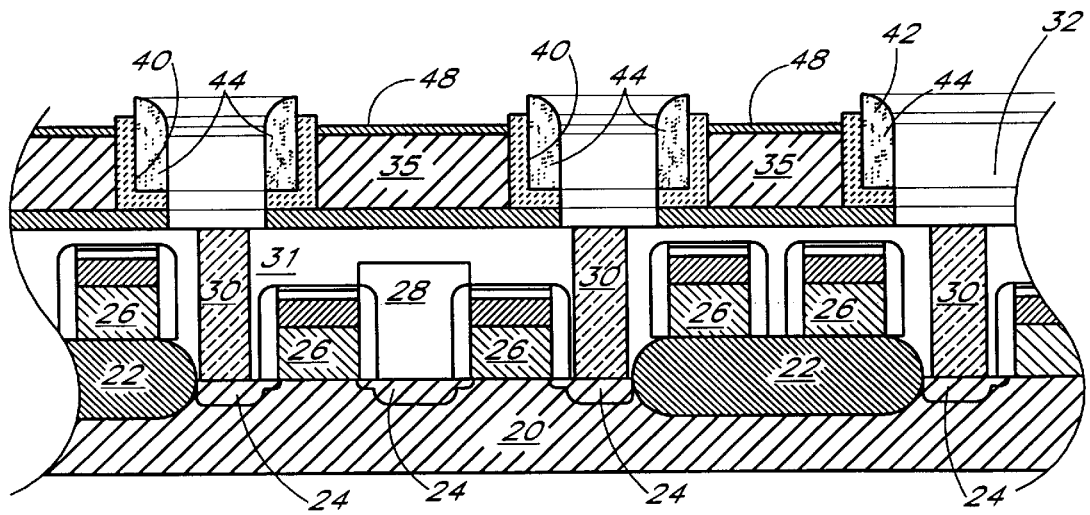

Similarly, the lower insulating layer 32 overlaying the capacitor plugs 30 is also dry etched to expose the plugs 30, as shown in FIG. 10. In doing so, however, the upper insulating layer 46 (FIG. 9) will also be etched back, but because this layer is made thicker than layer 32, there will be a thin residual layer 48 (FIG. 10) overlaying the common electrode 35.

Figure 11:
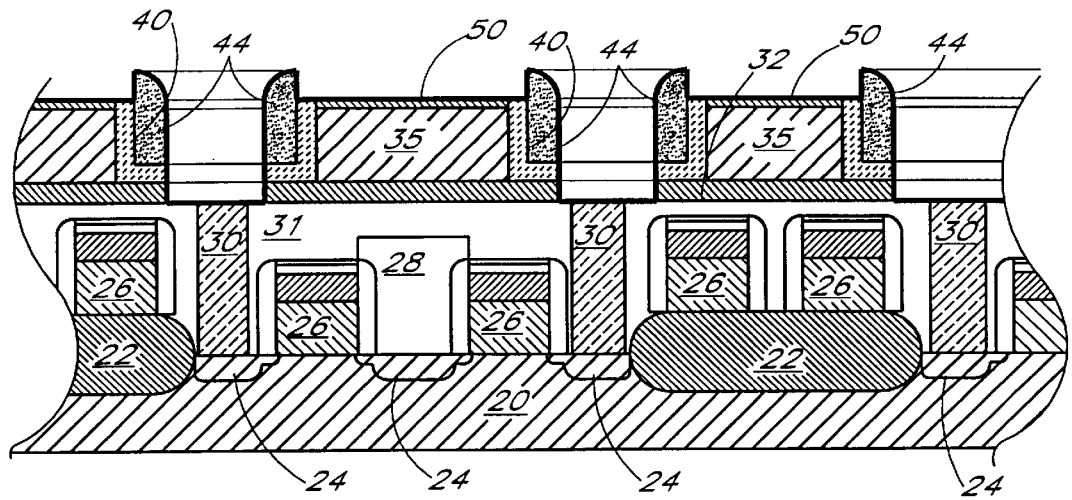

At this point in the process flow, it is preferable to deposit a conformal, passive and highly conductive thin film 50 to form an inner electrode lining, as shown in FIG. 11. The conductive film contacts the polysilicon plug 30, electrically connecting it to the storage node electrodes 44. A preferred material for the film 50 is a sputtered titanium film or more preferably CVD-Ti or CVD-TiN films. The film 50 serves as a passivating layer for the presently exposed surfaces in preparation for subsequent processing, has a high conductivity, and good temperature stability.

Figure 12:
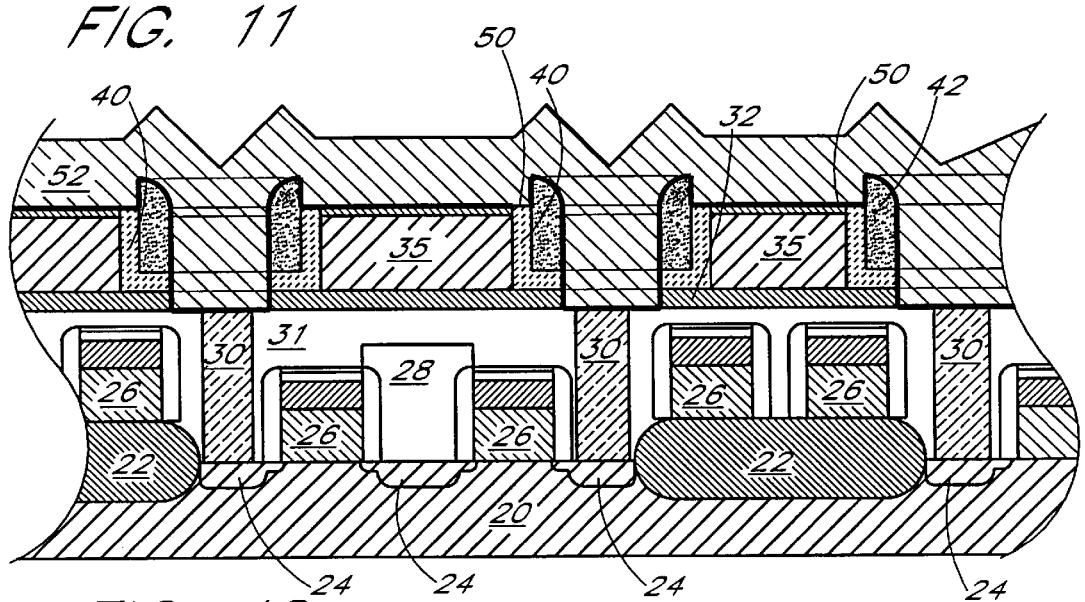

The remaining voids in the basic capacitor structure are filled by depositing a highly conductive filler layer 52 as shown in FIG. 12. Possible materials include refractory metals such as tantalum (Ta) or tungsten (W), but preferably tungsten due to its ease of deposition, good conformality, high conductivity and high temperature stability. A preferred W deposition comprises a CVD-W deposition which typically entails reduction of a volatile W-halide complex in a hydrogen ambient. The filler layer 52 is deposited to a thickness sufficient to fill the remaining void in the capacitor structure, as illustrated in FIG. 13.

Figure 13:
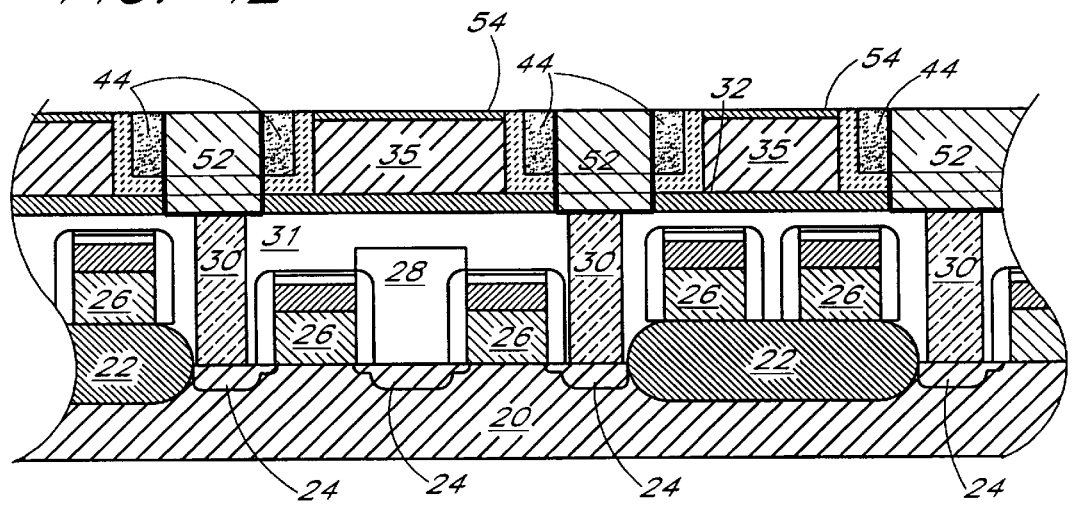

Completion of the capacitor structure comprises a planarization process to remove a topmost portion of the structure thereby forming a planar top surface 54 and a completed capacitor as shown in FIG. 13. A planarization process may comprise a chemical/mechanical polish or an etch comprising a mixture of ammonium hydroxide ($NH_4OH$) and hydrogen peroxide ($H_2O_2$). Alternatively a suitable dry etch may comprise a plasma of reactive halogen complexes such as $CF_4$. The result of this process step produces a planar top surface 54 at a height sufficient to define individual storage nodes 44 that are now connected to the underlying poly plugs 30.

Remaining process steps complete the DRAM formation by depositing suitable cap layers such as a passivating nitride layer. The DRAM capacitor of the present invention advantageously incorporates new high-ε dielectric materials into a structure which can be fabricated at dimensional tolerances below that of conventional lithography limits. The process herein disclosed further obviates the need for complex barrier layers during fabrication and allows for electrode deposition by relatively simple sputter deposition techniques.

Although described above with reference to the preferred embodiments, modifications within the scope of the invention may be apparent to those skilled in the art, all such modifications are intended to be within the scope of the appended claims.

What is claimed is:

1. A process for fabricating a capacitor in a semiconductor integrated circuit comprising the steps of:

depositing a lower insulative layer over a portion of the integrated circuit having a buried contact;

depositing a first conductive layer over the lower insulative layer;

depositing an upper insulative layer over the conductive layer;

removing a portion of the upper insulative layer and first conductive layer to define a capacitor region having a common capacitor electrode comprising a remaining portion of the first conductive layer bounding the capacitor region;

depositing a dielectric layer superjacent to the capacitor region, said dielectric layer comprising a material having a high dielectric constant;

depositing a second conductive layer superjacent to the dielectric layer;

removing a portion of the second conductive layer to form a storage node electrode within the capacitor region;

removing a portion of the dielectric layer to form a capacitor dielectric interposed between the storage node electrode and the common capacitor electrode;

removing a portion of the lower insulative layer exposing the buried contact; and depositing a third conductive layer over the capacitor region thereby electrically connecting the buried contact to the storage node electrode.

2. The process of claim 1 further comprising depositing a forth conductive material over the third conductive material to substantially completely cover the capacitor region; and planarizing the capacitor region to form an inner capacitor electrode insulated from the common electrode by the capacitor dielectric.

3. The process of claim 1, wherein the step of depositing the first conductive layer comprises sputter depositing a metal.

4. The process of claim 1, wherein the step of depositing the first conductive layer comprises sputter depositing a conductive metal oxide.

5. The process of claim 1, wherein the dielectric layer has a dielectric constant greater than about 100.

6. The process of claim 1, wherein the dielectric layer is a material selected from the group consisting of Barium Strontium Titanate (BST), Barium Titanate (BT), Strontium Titanate (ST) and Lead Zirconate Titanate (PZT).

7. The process of claim 1, wherein the dielectric layer comprises a ferroelectric thin film.

8. The process of claim 1, wherein the step of depositing a second conductive layer comprises chemical vapor depositing a conductive oxide or nitride composition.

9. The process of claim 1, wherein the step of depositing a third conductive layer comprises chemical vapor depositing a conductive oxide or nitride composition.

10. The process of claim 2, wherein the step of depositing a fourth conductive layer comprises chemical vapor depositing a refractory metal composition.

11. A method for fabricating an array of DRAM storage capacitors comprising the steps of:

forming an outer conductive layer over a portion of an integrated circuit having a plurality of DRAM access devices and a plurality of buried contacts thereto;

removing portions of the outer conductive layer to define capacitor regions disposed over the buried contacts, said capacitor regions having a common outer electrode comprising the outer conductive layer bounding the capacitor regions;

depositing a dielectric layer superjacent to the capacitor regions, said dielectric layer comprising a material having a high dielectric constant;

depositing an inner conductive layer superjacent to the dielectric layer;

removing portions of the inner conductive layer and dielectric layer within the capacitor regions to expose the buried contacts; and depositing a conductive layer over the capacitor regions to form an electrical connection between the inner conductive layer and the buried contacts.

12. A method of fabricating an array of thin film capacitors in an integrated circuit comprising the steps of:

forming a common electrode layer over the integrated circuit, said common electrode layer having an array of capacitor regions disposed therethrough;

forming a dielectric layer superjacent to the array of capacitor regions, said dielectric layer comprising a material having a high dielectric constant; and forming electrodes within the capacitor regions, said electrodes disposed adjacent to the dielectric layer thereby forming an array of capacitors having a common electrode layer.

13. The method of claim 12, wherein the step of forming the common electrode layer comprises sputter depositing a metal layer and removing portions of the metal layer to define the capacitor regions.

14. The method of claim 13, wherein the capacitor regions are separated by the common electrode layer having an intervening dimension of the less than 300 nm.

15. The method of claim 12, wherein the dielectric layer comprises a material having a dielectric constant greater than 100.

16. The method of claim 12, wherein the dielectric layer comprises a material selected from the group consisting of Barium Titanate, Strontium Titanate, Barium Strontium Titanate and Lead Zirconate Titanate.

17. The method of claim 12, wherein the step of forming the electrodes within the capacitor regions comprises chemical vapor depositing a transition metal complex.

* * * * *